United States Patent

[11] 3,588,615

[72] Inventors Lawrence E. Brearly;
Stanley M. Jensen, Apalachin; Vincent P. Subik, Binghamton; Gordon L. Williams, Vestal, N.Y.

[21] Appl. No. 15,701
[22] Filed Mar. 2, 1970
[45] Patented June 28, 1971

[73] Assignee International Business Machines Corporation
Armonk, N.Y.

[54] PLUGGABLE MODULE CONNECTOR SYSTEM
4 Claims, 3 Drawing Figs.

[52] U.S. Cl. .......... 317/101CC, 339/17, 339/176
[51] Int. Cl. .......... H05k 1/04
[50] Field of Search .......... 317/101 (DH), 101 (D), 101 (CC); 339/176 (MF), 176 (MP), 176, 17 (M), 176 (M), 176 (C), 17 (F)

[56] References Cited

UNITED STATES PATENTS

| | | | |
|---|---|---|---|
| 3,152,288 | 10/1964 | Mittler | 317/101DH(UX) |
| 3,340,439 | 9/1967 | Henschen et al. | 317/101D(UX) |
| 3,356,983 | 12/1967 | Johnson, Jr. | 339/17M(UX) |
| 3,409,732 | 11/1968 | Dahlgren | 317/101D(UX) |
| 3,434,687 | 3/1969 | Boyer | 317/101DH(UX) |
| 3,500,289 | 3/1970 | Herb | 339/17F(UX) |
| 3,529,213 | 9/1970 | Farrand | 317/101CC(UX) |

*Primary Examiner*—David Smith, Jr.
*Attorneys*—Hanifin and Jancin and Charles S. Neave

ABSTRACT: A pluggable module connector assembly comprising a lattice member adapted for receiving and removably holding a plurality of circuit modules. The modules have contact areas along the peripheral edges to accommodate input/output signals, power and ground potentials. The lattice member is registered and attached to a printed circuit board and has molded elastomer sections secured to the lattice channels which serve as pressure pads when the module connector leads are brought into contact with an electrical interconnector element. The electrical interconnector element is a flexible film with conductive printed circuit lines affixed thereto and overlying the elastomer sections. The conductive lines are interconnected with the circuit pattern of the printed circuit board. Modules are individually located within receptacles of the lattice member and attached thereto by a loading frame secured at the lattice member intersections.

INVENTOR
LAWRENCE E. BREARLEY
STANLEY M. JENSEN
VINCENT P. SUBIK
GORDON L. WILLIAMS

BY [signature]
AGENT

PLUGGABLE MODULE CONNECTOR SYSTEM

BACKGROUND OF THE INVENTION

1. Field of the Invention

This invention relates to connector apparatus for removably holding circuit modules, and more particularly, to multicontact electrical connectors for making interconnections between a plurality of groups of circuit components.

2. Description of the Prior Art

In conventional module connector assemblies, a quantity of modules are attached to a printed circuit card which may then be interconnected with a main printed circuit board. Printed circuit cards of this type are very costly to manufacture, and if a single module becomes defective it is necessary to remove the entire printed circuit card on behalf of the single defective module. Sometimes the card can be repaired by replacement of the defective module, but this cannot usually be accomplished in the field because of a need for sophisticated tools to effect the change. Consequently, the printed circuit card must usually be returned to the manufacturing location for repair which is both costly and time consuming. Therefore, what is needed is improved means for detachably mounting discrete module components with adequate interconnecting facility which is economical, can be conveniently repaired, and is adapted to readily carry out module changes at the machine locations.

SUMMARY OF THE INVENTION

The pluggable module connector system of the present invention overcomes disadvantages of prior known constructions and includes the features and advantages of providing a good, individually detachable module connector assembly enabling the connecting of the input/output conductive elements of a module with the corresponding conductive elements of a main printed circuit board within a data processing system.

Briefly, the pluggable module connector system assembly comprises flexible film interconnecting elements having etched circuit patterns on one side and a solid ground circuit layer on the other side for matched impedance. The interconnecting elements on the flexible films are registered and soldered to a main printed circuit board. The connector assembly includes a latticed frame for receiving and detachably holding and supporting a plurality of individual circuit modules in spaced relationship to the main printed circuit board. The flexible film interconnecting elements function to electrically interconnect the modules with the circuits of the main printed circuit board. The pluggable module connector system provides good electrical connections between a plurality of circuit modules and a main printed circuit board.

It is a primary object of the invention to provide an improved pluggable module connector system adaptable for inclusion within a data processing system.

It is a further object of the invention to provide a high density interconnecting assembly having the capability of providing good electrical connections between the module elements and a main printed circuit board.

The foregoing and other objects, features and advantages of the invention will be apparent from the following, more particular description of preferred embodiments of the invention, as illustrated in the accompanying drawings.

DESCRIPTION OF THE PREFERRED EMBODIMENTS

Figures 1, 2:
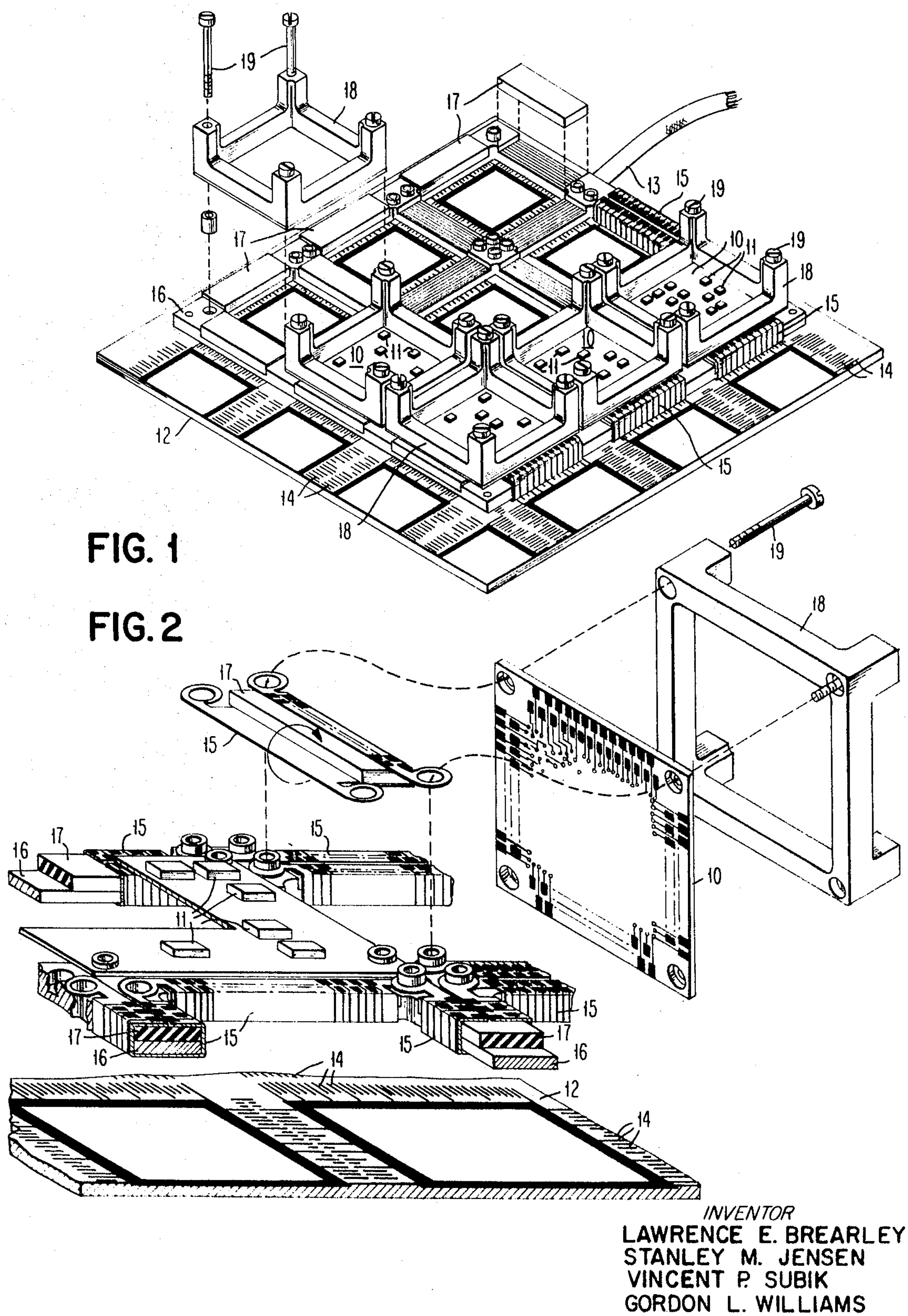
FIG. 1 is an isometric view of interconnecting and pressure-applying apparatus for module edge connecting and I/O strips according to the present invention.
FIG. 2 is an enlarged exploded and fragmentary isometric view of a portion of the module interconnecting and pressure-applying apparatus.

The invention comprises a plurality of substantially square shape modules 10, each having a number of circuit chips 11 attached thereto. The miniaturized circuit chips 11 of the modules 10 are preferably logic circuits suitable for use in data processing systems of various types, but the types of circuits are immaterial to the instant invention. The modules 10 may be a substrate or dielectric material such as ceramic, epoxy glass or the like for supporting a plurality of microelectric circuit chips. The under face of the module includes a matrix array of conductor lines with selected leads of the chips being connected to selected ones of the conductive lines in the matrix array and in accordance with a predetermined connecting configuration. Alternatively, the circuit modules 10 may be of a planar-type structure with through holes or "via" means of interconnecting the chips and the conductive lines on the under face of the module. The structure of the modules is so developed as to be particularly adaptable to fabrication by computer design and capable of automatic assembly so that machine production of the modules is readily effected.

A printed circuit board 12 is a basic unit of a data processing system. The boards 12, as needed, are used to provide the required circuitry for a particular data processing system. The boards 12 are interconnected by coaxial cables 13 and/or other cabling means. The cables are disposed in channels between or below the boards 12.

The printed circuit board 12 has a matrix array of conductive lines 14 affixed thereto. Integral with the printed circuit board 12 and attached to the conductive lines by solder, infrared or equivalent process are a plurality of two-sided printed circuit polyimide film overlay circuit interconnecting elements 15. The overlay film is a thin, flexible material such as KAPTON (trademark of E. I. du Pont de Nemours) or the like. The overlay film 15 is a two-sided copper-clad polyimide. A circuit pattern is etched, plated, and insulated on one side of the film 15. The other side of the film has a solid copper ground plane. Interconnections are made via through plated holes at appropriate points between the ground plane and ground lines on the conductive circuit side.

A steel lattice member 16 of one piece channel construction and containing an array of receptacle openings corresponding to the number of modules required is registered to the board 12 artwork and epoxied to the board 12 surface. Contact between the lattice frame 16 and the board 12 occurs only at the intersections of the lattice 16 structure. Elastomer pressure pad sections 17 are attached within the lattice 16 channels as shown in the drawings (FIGS. 1 and 2) and function as pressure pads to enable electrical connections, which function will become more apparent as the description proceeds.

After locating the lattice 16 structure to the printed circuit board 12, the printed circuit overlay film 15 is formed around and epoxied to the sides of the lattice structure 16. The free ends of the film 15 are formed about the channels of the lattice structure 16 in a wraparound fashion and overlie the elastomer pressure pads 17.

Figure 3:
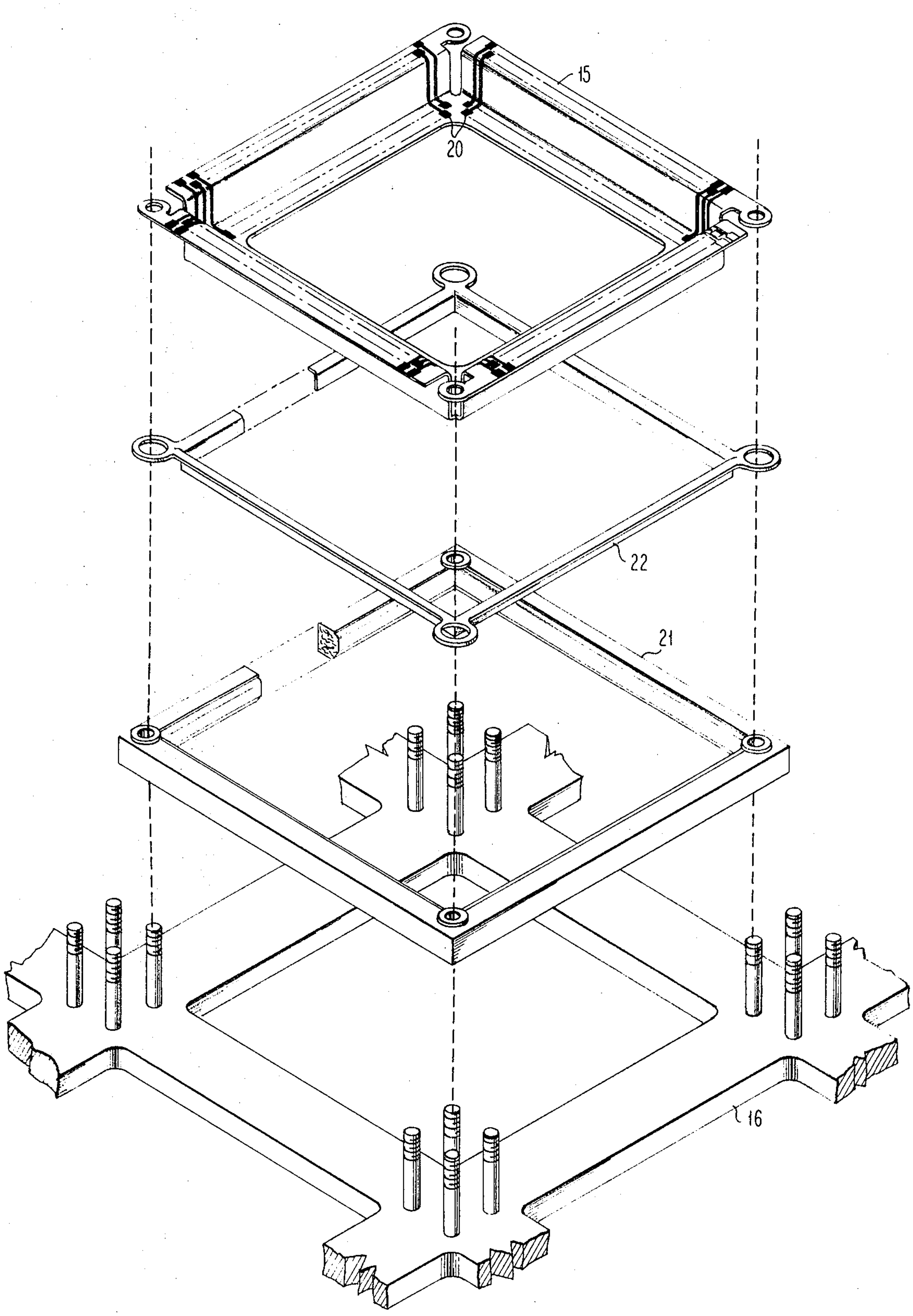
FIG. 3 is an exploded and isometric view of an alternative module interconnecting and pressure-applying apparatus.

Modules 10 can then be located within the lattice 16 receptacle by means of corner bevels or dowels and supported in spaced relationship above the printed circuit board 12 surface. Module leads are in registered position to the conductive lines on the printed circuit film 15 overlay. Individual loading frames 18 are located over the edges of the modules and secured at the corners to the lattice 16 channel section by means of screws 19 or alignment studs 23 (FIG. 3). These loading frames 18 uniformly distribute contact load between the module 10 conductive lines at the module edges and the conductive lines of the overlay film 15.

Alternatively, the overlay film 15 may be formed and secured as shown in the exploded isometric view of FIG. 3. In this arrangement, the conductive lines on the circuit overlay are attached to the printed circuit pattern on the main board. The elastomer pressure pad 21 is different in size and shape from pads 17, but the function remains the same. An alignment frame 22 is used to align and support the pressure pads 21 with respect to the lattice member 16.

Characteristic of this design, the contact forces developed within the system are confined to the lattice 16 structure and are not transmitted to the printed circuit board 12. Removal of a loading frame 18 permits module 10 extraction on an individual basis for replacement or for repair work. The pluggable module connector system also provides good electrical connections between the module edge connectors and the printed circuit board.

While the invention has been particularly shown and described with reference to the preferred embodiments thereof, it will be understood by those skilled in the art that various changes in form and details may be made therein without departing from the spirit and scope of the invention.

We claim:

1. A module to board connector assembly comprising:

a. a base board having a plurality of conductive circuit paths thereon;

b. a lattice frame member having a matrix array of module openings;

c. a flexible film connector element having a plurality of printed circuit paths thereon and enwrapping the cross-members of the lattice frame member;

d. module devices adapted to overlie the openings in the lattice frame member and having a plurality of input/output signal conducting paths terminating along the peripheral edges of the module devices; and e. a pressure applying means for each of said module devices adapted to apply forces to the module devices for interconnecting the cooperative module conductive paths with the printed circuit paths of the flexible film connector elements.

2. A module to board connector assembly as defined in claim 1 further including pressure-applying means underlying the flexible film connector elements and intermediate of the intersections of said lattice frame member and adapted to cooperate with the pressure-applying means for improving the contacting arrangement of the cooperative conductive elements.

3. A module to board connector assembly comprising:

a. a base board having a plurality of conductive circuit patterns thereon;

b. a lattice frame structure having a matrix array of module openings;

c. molded elastomer pressure pads attached to the lattice frame structure intermediate of the intersections;

d. a flexible film connector element having a plurality of printed circuit paths thereon and overlying the pressure pads and with the circuit paths electrically interconnected to the circuit patterns on the base board in accordance with a predetermined arrangement;

e. module devices adapted to overlie the module receptacle openings and having input/output signal conducting paths terminating along the peripheral edges of the module devices; and f. a holding frame member for each module device designed for attachment at its corners with the lattice frame member and adapted to bear against its related module device so as to force the conducting path terminations along the module edges into electrical contact with the film connector element.

4. A module to board connector assembly as defined in claim 3 wherein said flexible film connector element is further characterized as a polyimide substrate having a plurality of conductive circuit lines on one side thereof and a solid ground conductive layer on the other side for producing matched impedance electrical characteristics.